United States Patent
Xiao et al.

(10) Patent No.: US 8,405,535 B1
(45) Date of Patent: Mar. 26, 2013

(54) INTEGRATED CIRCUIT WITH CONFIGURABLE ANALOG TO DIGITAL CONVERTER

(75) Inventors: Ping Xiao, East Palo Alto, CA (US); Weiying Ding, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 50 days.

(21) Appl. No.: 13/205,512

(22) Filed: Aug. 8, 2011

(51) Int. Cl.
*H03M 3/00* (2006.01)

(52) U.S. Cl. .................................. 341/143; 341/155

(58) Field of Classification Search .................. 341/143, 341/155
See application file for complete search history.

(56) References Cited

U.S. PATENT DOCUMENTS

| | | | | |
|---|---|---|---|---|
| 6,087,969 A | * | 7/2000 | Stockstad et al. | 341/143 |
| 6,489,907 B2 | * | 12/2002 | Cusinato et al. | 341/143 |
| 6,577,258 B2 | * | 6/2003 | Ruha et al. | 341/143 |
| 7,129,873 B2 | * | 10/2006 | Kawamura | 341/143 |
| 7,532,138 B2 | * | 5/2009 | Akizuki et al. | 341/143 |
| 8,040,266 B2 | * | 10/2011 | Thiagarajan et al. | 341/143 |

* cited by examiner

*Primary Examiner* — Khai M Nguyen
(74) *Attorney, Agent, or Firm* — Womble Carlyle Sandridge & Rice, LLP

(57) ABSTRACT

Circuits, methods, and systems for implementing an Analog to Digital Converter (ADC) in an Integrated Circuit (IC) are provided. An IC includes an analog modulator, a digital filter coupled to the analog modulator, and a decimator coupled to the digital filter. The analog modulator includes one or more discrete integrators and a feedback path. A first discrete integrator from the one or more discrete integrators is operable to receive an analog input of the ADC. The feedback path couples an output of the analog modulator to at least one of the one or more discrete integrators. Further, the decimator is operable to produce the output of the ADC, and the IC is operable to receive an IC configuration file that specifies how the discrete integrators are connected in the analog modulator, parameters of the digital filter, and parameters of the decimator.

24 Claims, 10 Drawing Sheets

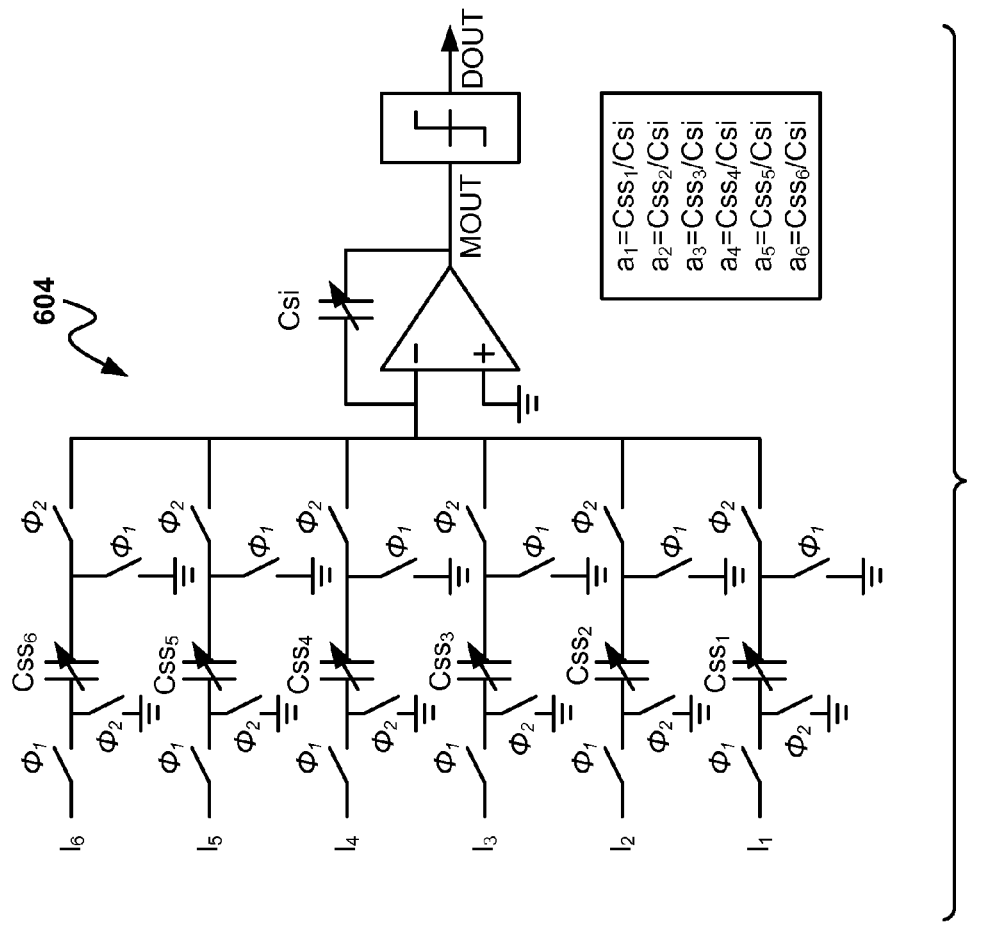
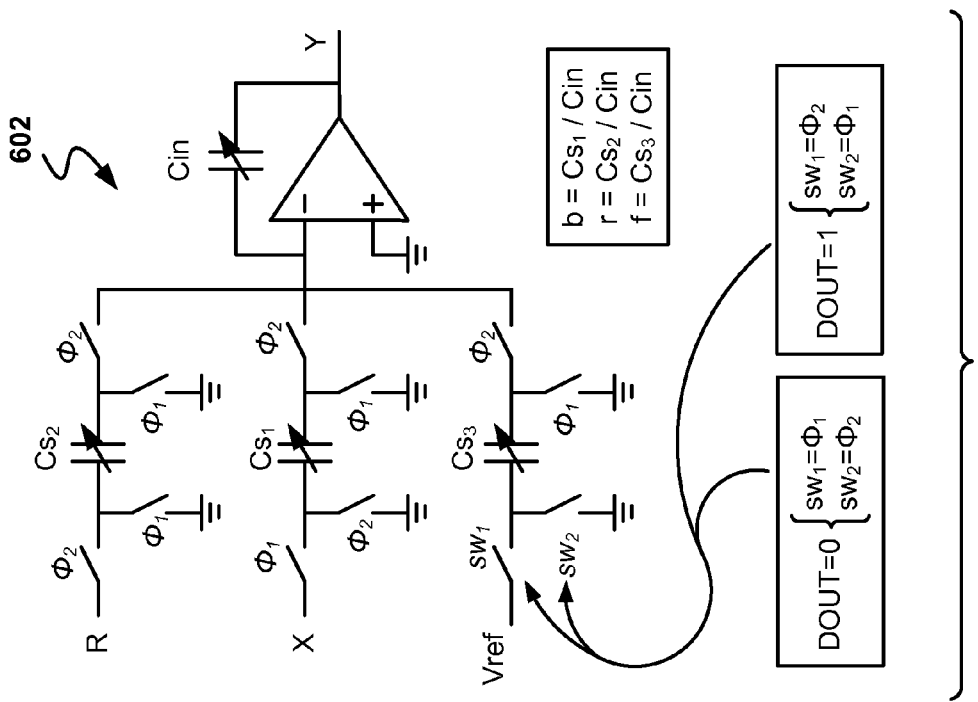
Fig. 8
Fig. 7

| | $C_4$ | $C_3$ | $C_2$ | $C_1$ | $C_{Total}$ |
|---|---|---|---|---|---|
| Capacitor Units | 5 | 2 | 2 | 1 | |
| | 0 | 0 | 0 | 0 | 0 |
| | 0 | 0 | 0 | 1 | 1 |
| | 0 | 0 | 1 | 0 | 2 |
| | 0 | 0 | 1 | 1 | 3 |
| | 0 | 1 | 1 | 0 | 4 |
| | 1 | 0 | 0 | 0 | 5 |
| | 1 | 0 | 0 | 1 | 6 |
| | 1 | 0 | 1 | 0 | 7 |
| | 1 | 0 | 1 | 1 | 8 |
| | 1 | 1 | 1 | 0 | 9 |
| | 1 | 1 | 1 | 1 | 10 |

INTEGRATED CIRCUIT WITH CONFIGURABLE ANALOG TO DIGITAL CONVERTER

BACKGROUND

Today's Programmable Logic Devices (PLDs) possess ever-improving features, which include improved techniques to reconfigure the PLD, and PLDs having increased performance. These features tend to be related to operations in the digital domain. However, PLDs lack the ability to interface directly in the analog domain, mainly because the architecture of most of Analog-to-Digital Converters (ADC) is application specific, and because analog design techniques are often incompatible with digital design techniques.

There is a lack of PLD-integrated ADCs with flexible configuration features. In order to interface with the analog domain, PLD designers have to utilize stand-alone external ADC devices that are connected to PLDs on a circuit board through standard digital Input/Outputs. This results in less-than-optimum system performance and significant system integration costs. As more and more system designs include PLDs, it is highly desirable to have PLDs with configurable analog interfaces. For example, rapid progress in the wireless communication arena demands flexible wireless receivers with an analog front-end.

It is in this context that embodiments arise.

SUMMARY

Embodiments provide circuits, methods, and systems for implementing an Integrated Circuit (IC) with an embedded Analog to Digital Converter (ADC). In one embodiment, an IC includes an analog modulator, a digital filter coupled to the analog modulator, and a decimator coupled to the digital filter. The analog modulator includes one or more discrete integrators and a feedback path. A first discrete integrator from the one or more discrete integrators is operable to receive an analog input of the ADC. The feedback path couples an output of the analog modulator to at least one of the one or more discrete integrators. Further, the decimator is operable to produce the output of the ADC, and the IC is operable to receive an IC configuration file that specifies how many discrete integrators are to be used in the analog modulator, parameters of the digital filter, and parameters of the decimator.

In another embodiment, an integrated circuit (IC) with an analog to digital converter includes a sigma delta (SD) analog modulator, a digital filter coupled to the SD analog modulator, and a decimator coupled to the digital filter. The SD analog modulator includes a plurality of discrete integrators coupled serially, a feedback path, and configurable feedback couplings. Further, the first discrete integrator from the plurality of discrete integrators is operable to receive the analog input of the ADC. The feedback path couples an output of the analog modulator to at least one discrete integrator from the plurality of discrete integrators. The configurable feedback couplings couple the outputs of the plurality of discrete integrators to the inputs of the plurality of discrete integrators. Further, the decimator is operable to produce the output of the ADC, and the IC is operable to receive an IC configuration file that specifies how many discrete integrators are to be used in the analog modulator, the feedback couplings, the parameters of the digital filter, and the parameters of the decimator.

In yet another embodiment, a method for operating an integrated circuit (IC) with an embedded analog to digital converter (ADC) is presented. The method includes an operation for receiving an IC configuration file at the IC, and an operation for receiving an analog input at an analog modulator in the IC. The analog input is converted to a digital signal. In another method operation, the digital signal is processed by a digital filter and a decimator to produce the output of the ADC. The IC configuration file specifies how many discrete integrators are to be used in the analog modulator, the parameters of the digital filter, and the parameters of the decimator.

It should be appreciated that embodiments can be implemented in numerous ways, such as a process, an apparatus, a system, a device or a method on a computer readable medium. Several inventive embodiments are described below. Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 7 illustrates details of a configurable SC integrator stage of the modulator of FIG. 6, according to one embodiment.

FIG. 8 illustrates a configurable adder of the modulator of FIG. 6, according to one embodiment.

DETAILED DESCRIPTION

Embodiments are presented for an Integrated Circuit (IC) with an embedded configurable Analog-to-Digital Converter (ADC). In one embodiment, the ADC includes a Sigma Delta (SD) structure. Sigma Delta ADCs provide analog front ends, and Digital Signal Processing (DSP) for Digital Low Pass Filters (DLPF) or Digital Band Pass Filters (DBPF) and decimators. Further, SD ADCs may be utilized in a variety of situations because the performance of the ADC can be adjusted based on the Over Sampling Rate (OSR) and the order of the sigma delta modulator. In addition, SD ADCs can be utilized for a wide range of input rates (e.g., bandwidths ranging from 0 to 20 MHz, or more), while providing an accuracy of up to 24 bits. Although embodiments are presented for SD ADCs, the principles presented can be utilized in other types of ADCs, and the embodiments are meant to be exemplary and not limiting.

It will be apparent, that the present embodiments may be practiced without some or all of these specific details. In other instances, well known process operations have not been described in detail in order not to unnecessarily obscure the present embodiments.

Figure 1:
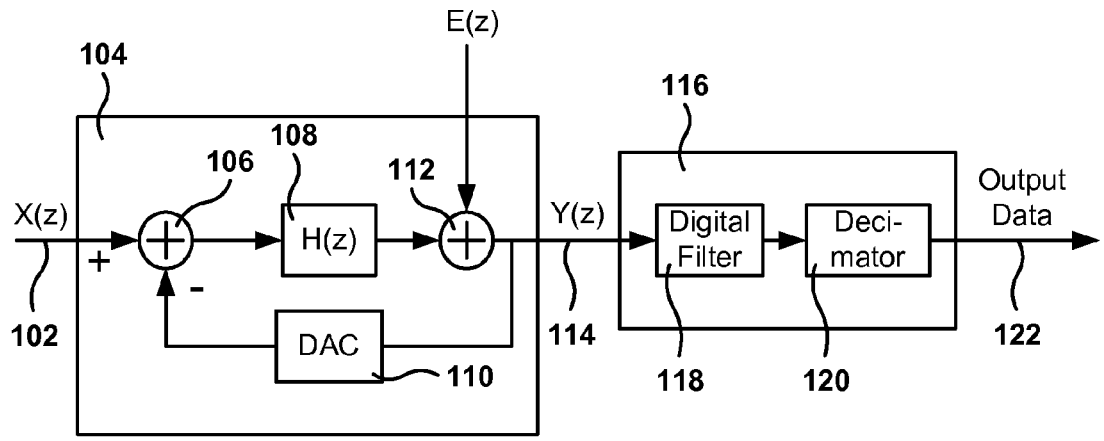
FIG. 1 shows a simplified structure of a Sigma Delta (SD) Analog to Digital Converter (ADC), according to one embodiment.

FIG. 1 shows a simplified structure of a Sigma Delta (SD) Analog to Digital Converter (ADC), according to one embodiment. The ADC includes an SD modulator 104 operating in the analog domain, and a digital processor 116 operating in the digital domain. Digital processor 116 includes digital filter 118 and decimator 120, where the output 122 of the ADC is the output of the decimator. Digital filter 118 can be a digital low-pass filter or a digital band-pass filter.

SD modulator 104 includes an integrator 108 with a discrete transfer function H(z); a quantizer 112 modeled as an addition of the integrator 108 output and the quantization noise E(z); and a Digital to Analog Convertor (DAC) 110 to feedback the digital modulator output 114 for combination with the analog modulator input 102 and form the SD modulator loop. Adder 106 subtracts the feedback from DAC 110 from ADC input 102 (represented as X(z)).

In one embodiment, the output 114 Y(z) of the SD modulator Y(z) is calculated according to the following formula:

$$Y(z) = \frac{H(z)}{1 + H(z)} * X(Z) + \frac{1}{1 + H(z)} * E(Z) \quad (1)$$

Equation (1) can be rewritten as follows:

$$Y(z) = Hx(z) * X(Z) + He(z) * E(Z) \quad (2)$$

In equation (2), $$Hx(z) = \frac{H(z)}{1 + H(z)},$$

which is me signal Transfer Function (STF) of the modulator, and $$He(z) = \frac{1}{1 + H(z)},$$

which is the Noise Transfer Function (NTF) of the modulator. In one embodiment, if H(z) is implemented with a discrete integrator with the sample capacitance equal to the integrating capacitance, the STF of the SD modulator is a unity-gain stage with a delay to the input signal, but the NTF of the SD modulator presents a high-pass characteristic.

The SD ADC performs oversampling. For example, for an input signal with a frequency of 1 MHz, the oversampling rate can be 125 MHz, although over values are also possible. In general, the higher the oversampling rage, the higher the accuracy of the conversion. The oversampled and modulated signal is first digitally filtered by the digital filter 118 to remove the non-linearly shaped out-band noise, then downsampled by decimator 120, to generate a digital signal with the desired rate. It is noted that decimator 120 can downsample the signal using a plurality of down-sampling ratios, and not necessarily using a factor of 10, as the name "decimator" may imply.

Embodiments present a PLD, such as a Field-Programmable Gate Array (FPGA), with one or more configurable SD modulators, a configurable digital filter, and a decimator. The order of the sigma delta modulator can be configured based on the application specification, e.g., the desired Signal to Noise Ratio (SNR), also known as the Dynamic Range (DR), and the Over Sampling Rate (OSR), etc. As described in more detail with reference to FIGS. 6-11, the modulator includes, in one embodiment, a cascade of Switched Capacitor (SC) integrators, a quantizer (e.g., 1-bit, although a higher number of bits is also possible), and a DAC (e.g., 1-bit, although a higher number of bits is also possible).

The parameters determining the structure of the ADC are configurable. The ADC is embedded in a programmable device, and the configuration of the ADC is part of the configuration file for the programmable device. The configuration file includes a plurality of Configuration Random-Access Memory (CRAM) bits used to set the parameters of the ADC, as described in more detail below. The parameters that can be configured include the number of stages of the analog integrator, the interconnections within the ADC (e.g., a feedback path from the DAC, or a feedback path within a stage of the analog integrator), the strengths of the interconnections (e.g., the gains of the interconnection paths), parameters of the digital filter, parameters of the decimator, type of filter (e.g., low-pass or band-pass filter), etc.

It is noted that the embodiments presented are exemplary. Other embodiments may utilize a different number of stages, different interconnections, different filter types, etc. The embodiments should therefore not be interpreted to be exclusive or limiting, but rather exemplary or illustrative.

Figure 2:
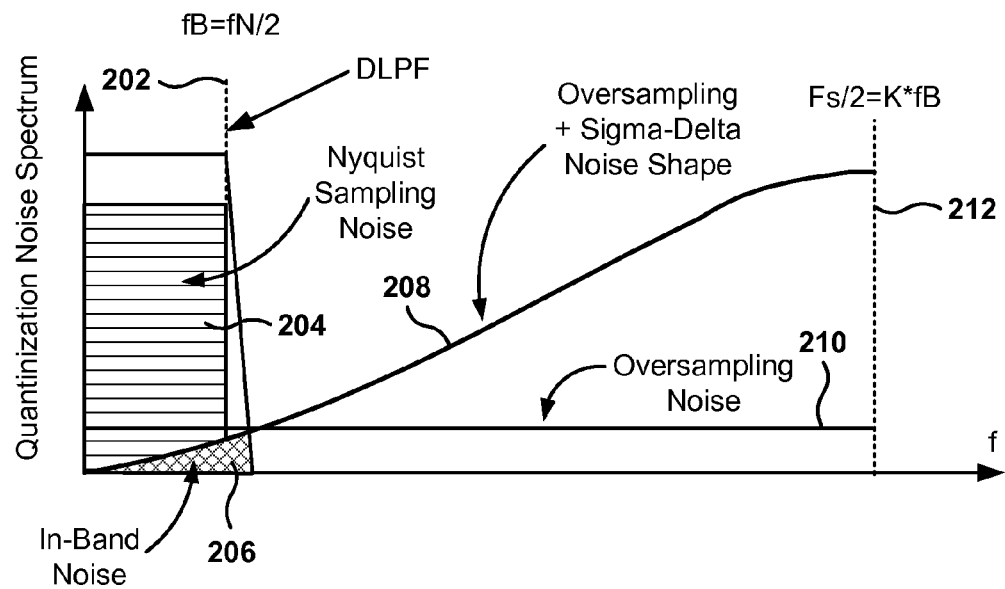
FIG. 2 shows a chart comparing the noise spectrum of different types of low pass ADCs (Nyquist, Oversampling, and SD), according to one embodiment.

FIG. 2 shows a chart comparing the noise spectrum of different types of low pass ADCs (Nyquist, Oversampling, and SD), according to one embodiment. The input signal has a bandwidth of fB 202. Under Nyquist sampling techniques, where fN is the Nyquist sampling of two times fB, the quantization noise energy 204 is distributed evenly within fB (assuming white noise). When using oversampling, the OSR is calculated with the formula $$OSR = K = \frac{Fs}{2 * fB},$$

where Fs is the over sampling frequency. The over sampling noise 210 is spread evenly across the band ranging from 0 to Fs/2 212.

When oversampling is applied to a low-pass SD modulator, the noise distribution 208 is non linear, and the NTF presents a high-pass characteristic in the band from 0 to Fs/2 212. The noise shaping curve of the SD modulator presents a high-pass characteristic that further suppresses the in-band noise 206. The DLPF filters the out-of-band noise, and the recovered signal contains less noise than the normal Nyquist filter or the signal obtained through oversampling conversion. For this reason, the SD ADC is highly accurate.

Figure 3:
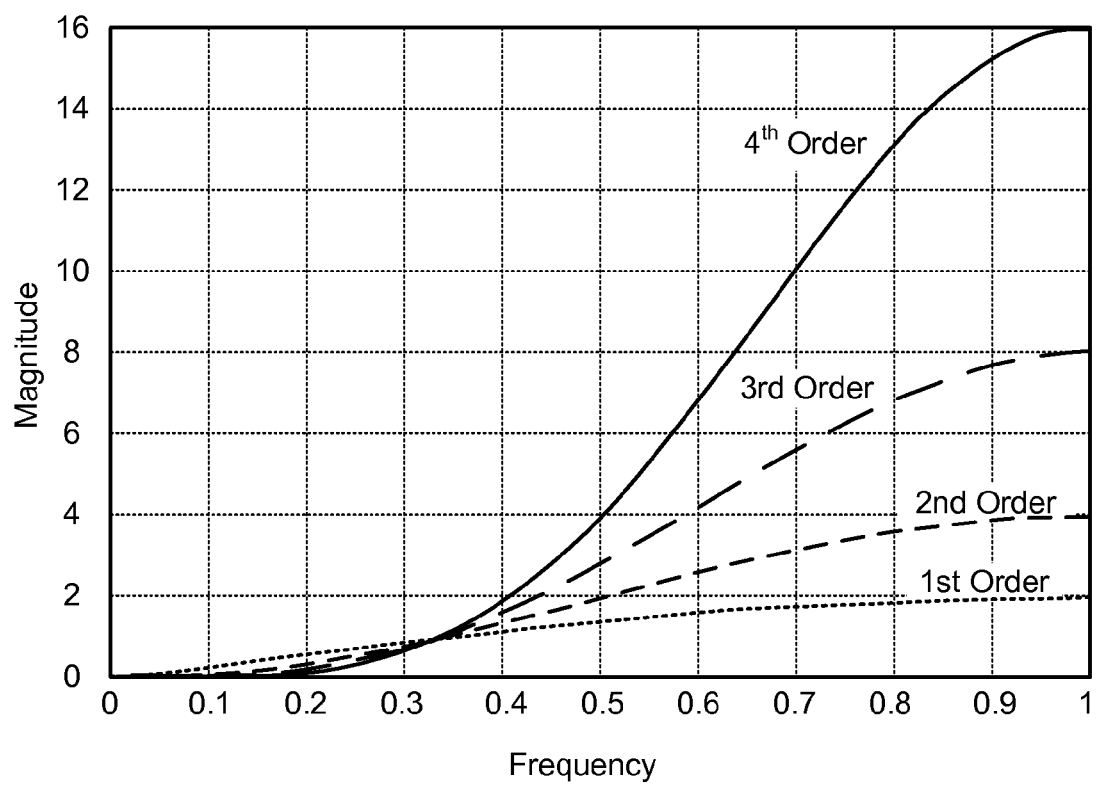
FIG. 3 shows a chart for the Sigma Delta ADC noise shape for modulators of different orders, according to one embodiment.

FIG. 3 shows a chart for the SD ADC noise shape for modulators of different orders, according to one embodiment. The noise characteristic of the SD modulator is a function of the order of the modulator, with high-order modulators having more in-band noise suppression than low-order modulators. FIG. 3 shows the noise transfer function curves of a low-pass SD modulators of different orders.

As described above with regard to FIG. 2, the quantization noise energy spreads evenly through the band ranging from 0 to Fs/2, where Fs is the sampling frequency. Consequently, a higher OSR will result in less quantization noise in a given signal band, where the SD ADC's Signal-to-Noise Ratio (SNR) is a function of the OSR. The SNR is a function of both the order and the OSR of the modulator, where high-order modulators or high OSRs generate higher SNRs. Accordingly, the performance of the SD ADC can be configured by changing the order of the integrator or by changing the OSR of the SD modulator.

The SD modulator can be implemented as a band-pass filter by adjusting the structure of the transfer function H(z). Working with a DBPF and a decimator, the band pass type modulator can be implemented with a band pass SD ADC.

Figure 4:
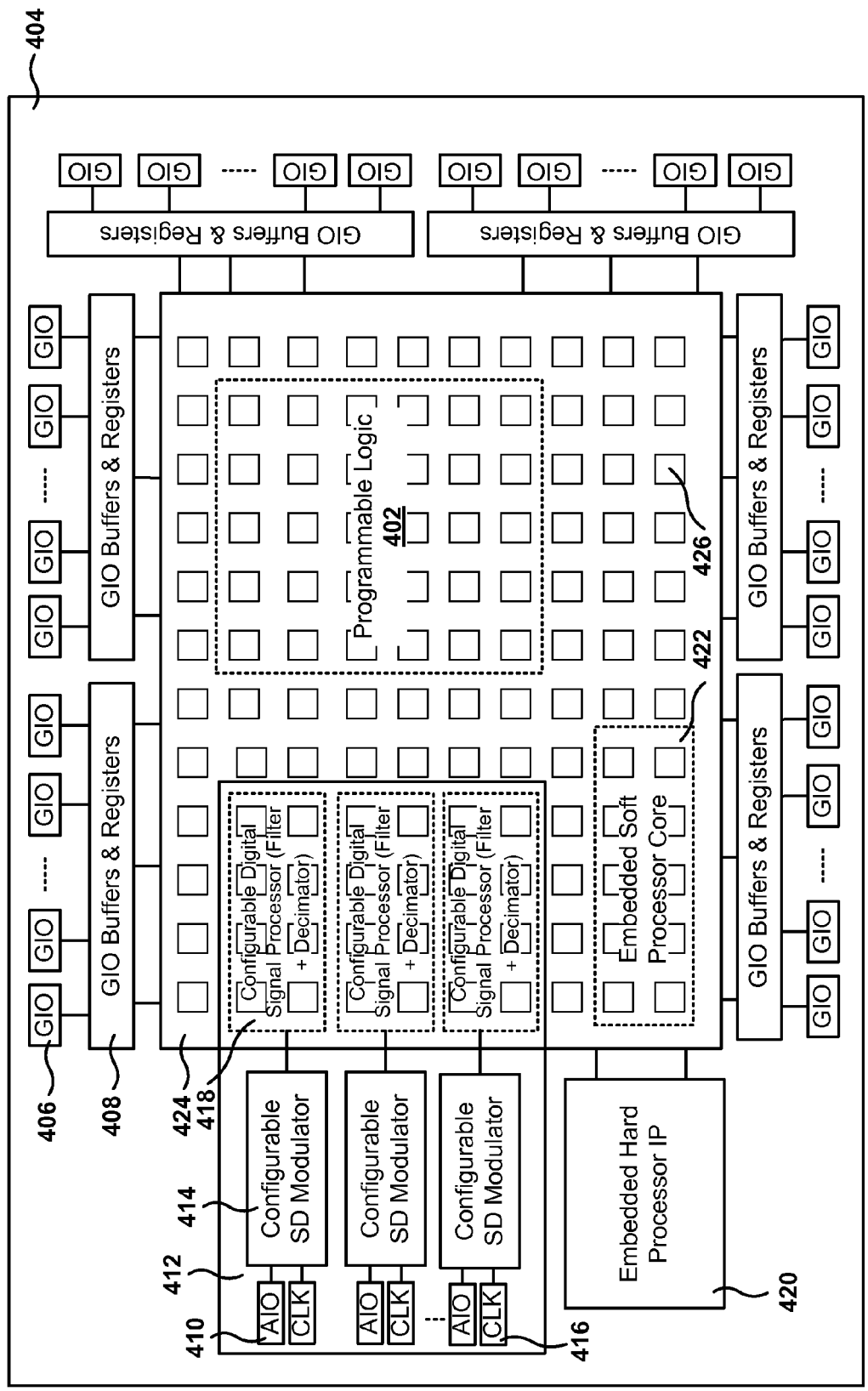
FIG. 4 is a diagram of a Programmable Logic Device (PLD) with a configurable SD ADC, according to one embodiment.

FIG. 4 is a diagram of a Programmable Logic Device (PLD) with a configurable SD ADC, according to one embodiment. In one embodiment, the PLD 404 is a FPGA and includes conventional FPGA programmable resources, such as FPGA core 424 and General Input/Outputs (GIOs). The FPGA core 424 includes programmable core blocks 426 that can be programmable logic blocks, programmable DSP blocks, or embedded memory blocks. The GIOs include GIO registers 406 and GIO buffers 408. Programmable logic 402 and embedded soft processor core 422 are application functional blocks configured using the programmable resources 426 in the FPGA core 424.

Furthermore, the PLD integrates one or more configurable ADCs 412, which are one or more configurable SD ADCs. Each configurable SD ADC includes one or more analog IOs (AIO) 410 to receive the analog input signal to be converted, a clock input (CLK) 416, a configurable SD modulator 414, and a configurable digital signal processor 418. In one embodiment, the configurable digital signal processor 418 is also implemented using the programmable resources 426 in the FPGA core 424. The CLK input 416 is utilized to receive the clock signal used for sampling and for the operation of the digital filter and the decimator. In another embodiment, the clock signal for the ADC is generated within the PLD and a CLK input 416 is not required for the ADC 412. In yet another embodiment, a single ADC can be used to convert several analog inputs, as long as the sampling rates are high enough for the ADC to independently sample the two or more analog signals.

The configurable digital signal processor 418 includes a digital filter (low pass or band pass), and a decimator. In one embodiment, the configurable digital signal processor 418 is implemented with conventional PLD core resources. In another embodiment, the configurable digital signal processor 418 is implemented using additional resources not found in the conventional PLD core. By including an embedded processor Intellectual Property (IP) core, the PLD device 404 becomes a Programmable System on Chip (PSOC) platform, and the ADC 414 can serve as an analog peripheral that enhances system performance. The embedded processor IP can be a hard IP core 420, or a soft IP core 422 using conversional PLD core resources.

Based on the requirements for the application of the PLD, the performance of the ADC can be adjusted by configuring the structure and the order of the modulator. In regards to the structure, there are two types of SD modulators: a single loop modulator and a multi-loop modulator, also referred to as a cascade modulator. For both types of modulators, the order of the modulator can vary, and the quantizer and the DAC can be single-bit or multi-bit. In general, the more complex the structure, the better the performance and also the higher the complexity of the design. For example, a single loop structure requires simpler design techniques than a multi-loop structure, but the single loop structure provides less in-band noise suppression using the same OSR.

High-order structures have better noise performance than a first or second level structure, but stability may be a concern and the structure may need to be optimized to operate properly. Multi-bit quantizers and DACs are better for noise shaping than single bit implementations, but require higher analog matching in the design. Thus, the structure complexity is selected by looking at these tradeoffs in one embodiment.

In one embodiment, the input to the digital filter, i.e., the output of the SD modulator, is a single bit stream at the SD modulator clock rate. The input to the digital filter includes the spectrum of the analog signal, which includes the signal bandwidth and the out-of-band quantization noise caused by the SD modulator oversampling. The digital filter filters out the out-of-band noise in the digital domain so the decimator can decimate the output signal at low frequency. Otherwise, the decimated output would have out-band noise aliased into the signal band.

Once type and structure of the digital filter is determined, the corresponding design parameters for the digital filter can be established based on the same design spec of the SD modulator. The digital filter design parameters include input data frequency; passband and stopband frequencies; stopband attenuation (related to the analog input signal bandwidth); output data accuracy (related to the SD modulator's SNR or DR) to determine the digital filter's word length; etc. A conventional filter design tool can take the defined design parameters and generate the filter coefficients in the specified word length (e.g., 16 bits), for the chosen digital filter structure. The filter coefficients determine the transfer function of the digital filter (based on the passband, stopband and stopband attenuation of the filter, etc.).

The decimator configuration includes a parameter that defines the ratio of the input frequency to the output frequency, which determines the division ratio or the OSR of the SD modulator. Once the parameters for the digital filter and the decimator are defined, the configuration of the PLD is determined. The digital filter design is entered as a schematic or as a verilog description, and the PLD and DSP tools perform the logic synthesis, partitioning, and physical mapping to configure the ADC for the PLD.

Figure 5:
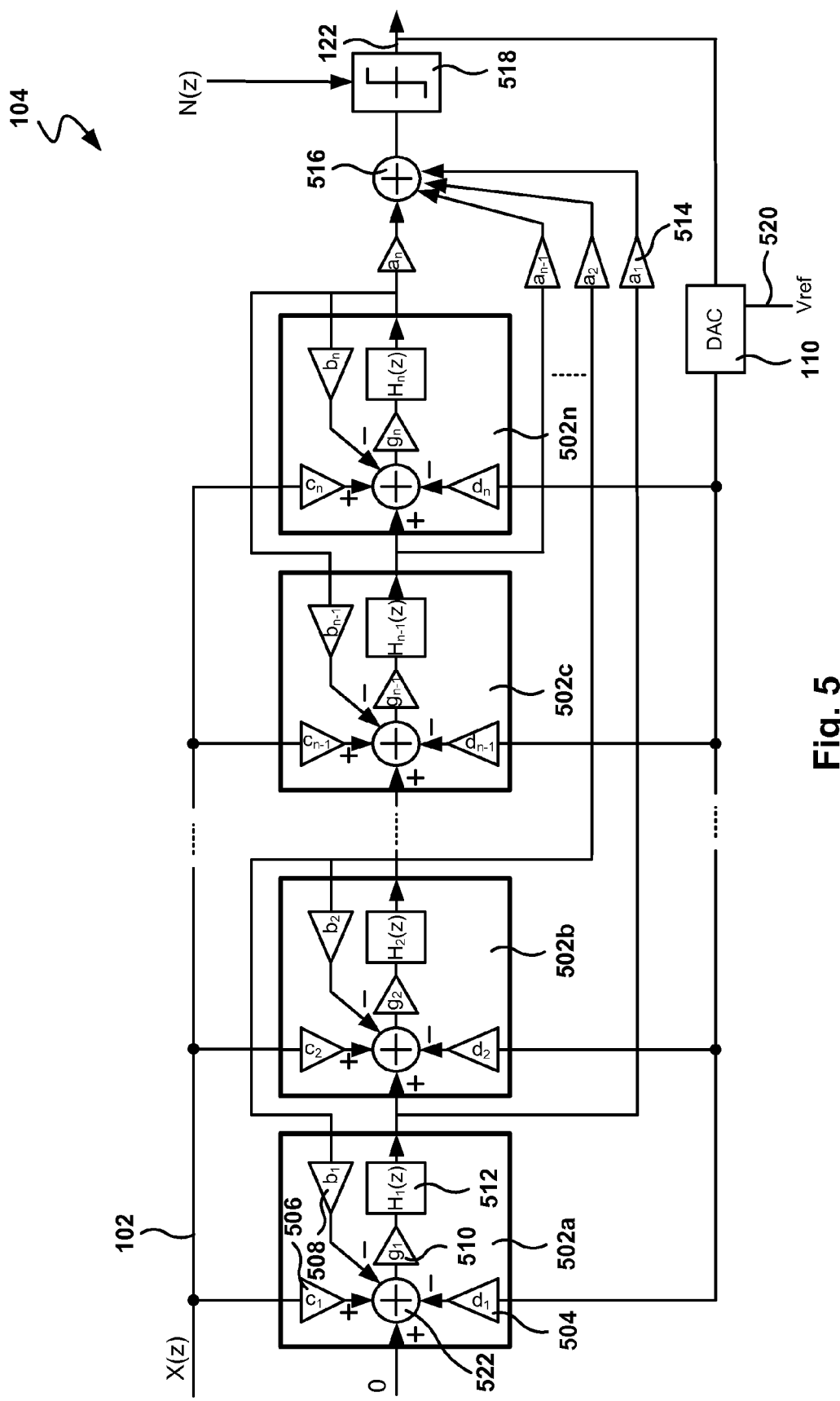
FIG. 5 is a diagram of a multi-order SD modulator, in accordance with one embodiment.

FIG. 5 is a diagram of a multi-order SD modulator, in accordance with one embodiment. The configurable SD modulator 104 is a single-loop modulator of order N, i.e., with N stages. The quantizer 518 and the DAC 110 can be single bit or multiple bit. The DAC receives an input voltage Vref 520. The configurable transfer function of the SD modulator H(z) is implemented in a cascade of N stages of discrete integrators 502a-502n with a configurable feed-forward path from each stage to the output, the feed-forward paths being combined by adder 516. H(z) is the transfer function for the whole SD modulator, while $H_i(z)$ is the transfer function for one of the integrators in each stage. The configuration of feed-forward path from each stage is represented by a configurable coupling such as coupling $a_1$ 514.

A configurable coupling is referred to herein as a coupling or connection between two elements of a circuit, where the coupling is an electronic circuit that is configurable. According to the configuration, the coupling can present an open circuit, a short circuit, a connection to ground or to a power source, an impedance, a gain, a loss, etc. The configurable couplings are also referred to herein as configurable connections, configurable gain amplifiers, amplifiers with variable gain, etc. In one embodiment, the configurable couplings are presented as amplifiers with variable gain, but other representations are also possible. Thus, the configurable couplings presented herein are meant to be exemplary and not limiting.

The feed-forward configurable couplings are combined by adder 516, and the result is the input for quantizer 518. In addition, the feedback path to each stage from the output 122 of the integrator is also configurable. The feedback paths are represented by the configurable couplings $d_i$ for each of the stages, such as $d_1$ 504 for the first stage (discrete integrator 502a) of the SD modulator.

The circuit of FIG. 5 also includes configurable couplings $c_i$, e.g., $c_1$ 506 in the first discrete integrator 502a, from the input of the integrator X(z) 102, to each of the stages. In addition, the configurable transfer function of the SD modulator H(z) includes a configurable local feedback path $b_i$ from the output of each even stage to the input of a previous two stages, that functions as a local resonator that creates zeros in the noise transfer function NTF of the modulator, thereby making the band-pass characteristic configuration possible.

As described above, $H_i(z)$ is the transfer function for one of the integrators in each stage (e.g., $H_1(z)$ 512 is the transfer function for the first stage, discrete integrator 502a). Each stage 502a-502n includes an adder (e.g. adder 522) that adds the inputs from configurable couplings $c_i$, $b_i$, and $d_i$, as described above. The output of the adder is connected to integrator $H_i(z)$ (e.g. integrator 512) through configurable coupling $g_i$ (e.g. coupling $g_i$ 510).

The configuration of the order and the structure of the modulator is achieved by specifying the gain or values for the configurable couplings $c_i$, and $g_i$. When a gain is configured with a value of "0" the path is removed from the circuit. In one embodiment, the optimization of the gain value of each path allows the optimization of the modulator performance, including the stability of the modulator, which is a concern for high-order SD modulators. The SD modulator of FIG. 5 shows a generic configurable structure. In one embodiment, the SD modulator is of the $6^{th}$ order or less, thereby providing enhanced stability.

Figure 6:
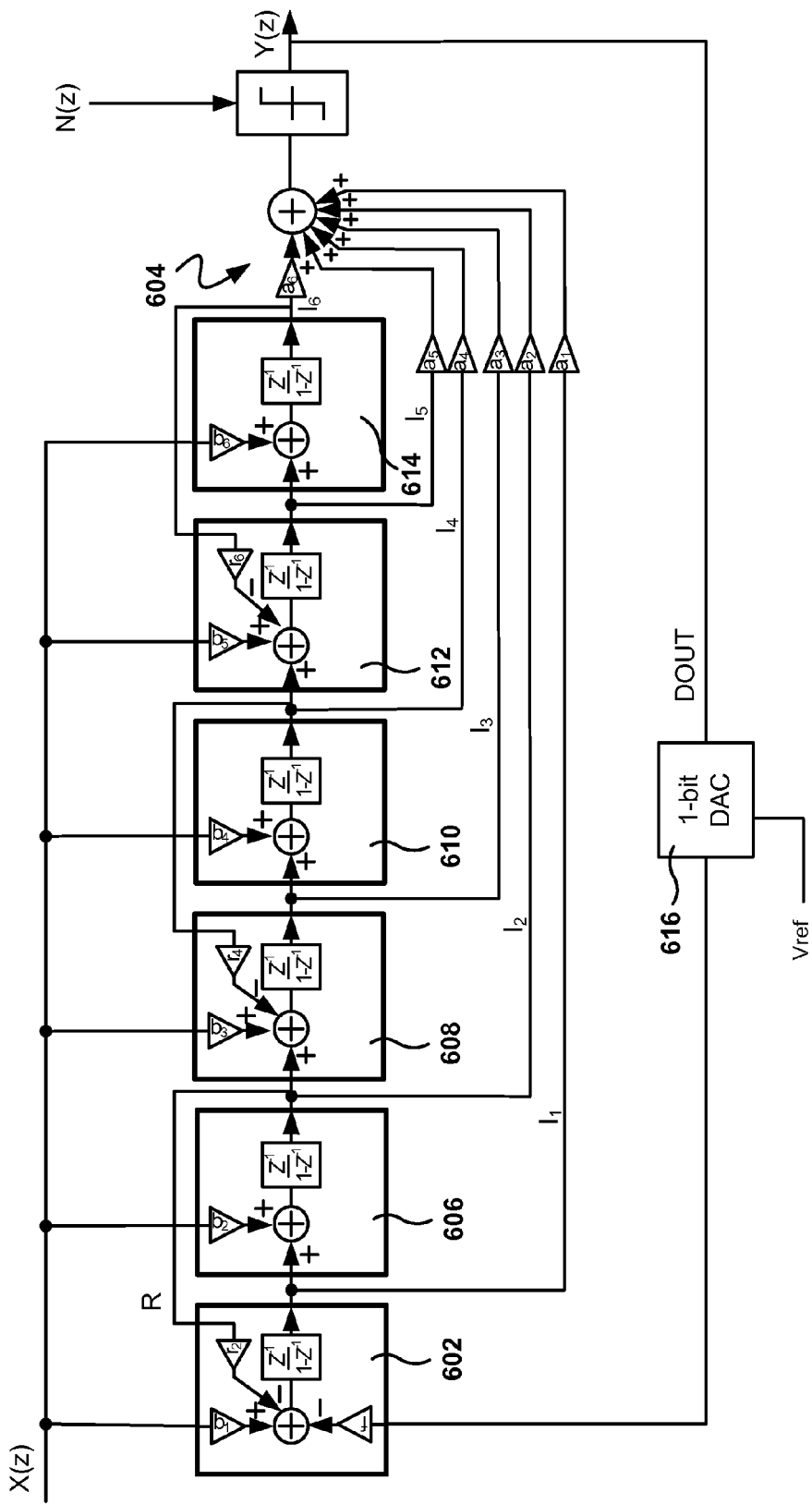
FIG. 6 is a diagram of a configurable sixth-order, single-loop, single-bit switch-capacitor (SC) SD modulator, according to one embodiment.

FIG. 6 is a diagram of a configurable, sixth-order, single-loop, single-bit switch-capacitor (SC) SD modulator, according to one embodiment. This type of modulator is referred to as a Cascade-of-Resonator with distributed Feed-Forward (CRFF) SD modulator. In this embodiment, the stages are not all equal; stages 606, 610, and 614 feedback to the previous stage, as indicated by configurable couplings $r_2$, $r_4$, and $r_6$. On the other hand, stages 602, 608 and 612 do not have a feedback connection from their output. Furthermore, the feedback from DAC 616 feeds only stage 602, as indicated by configurable connector f. The output L from each stage is configurable via configurable coupling as previously described. The input signal X(z) feeds each stage through configurable coupling $b_i$.

The embodiment of FIG. 6 provides a flexible and configurable structure for implementing an ADC in a PLD. In one embodiment, the quantizer and the DAC are 1-bit and each integrator stage is modularized, simplifying the integration into the design of the PLD. The configuration of the modulator structure is performed by configuring each of the gain coefficients of the different configurable couplings, as described in more detail with reference to FIGS. 7-11.

The transfer function of a unity gain switched capacitor integrator, expressed in the Z domain, is $$\frac{z^{-1}}{1-z^{-1}}.$$

A time domain expression can be mathematically converted to a Z domain expression for easy analysis. In the time domain, the input and output relationship of a unity gain SC integrator (Cs=Ci) can be expressed as y(n)=x(n−1)+y(n−1), assuming that each clock cycle is one time unit, where n represents the current time. In a time-to-Z domain conversion, y(n) is transformed to Y(Z), and y(n−1) to Y(Z)*$Z^{-1}$. The equation y(n)=x(n−1)+y(n−1) is transformed to the Z domain as Y(Z)=X(Z)*$Z^{-1}$+Y(Z)*$Z^{-1}$. Thus, the Z domain transfer function of the unity-gain switched capacitor integrator is Y(Z)/X(Z)=$Z^{-1}$/1−$Z^{-1}$.

FIG. 7 illustrates details of a configurable SC integrator stage of the modulator of FIG. 6, according to one embodiment. R is the input corresponding to the local feedback from stage 606, X is the input signal, and Vref is the reference voltage coupled to DAC 616 of FIG. 6.

The multiple $Cs_i$'s are switch capacitors, also referred to as sampling capacitors, and Cin represents the integrating capacitor. In a first phase, the input X and the feedback signals R and Vref are sampled through the sampling capacitors $Cs_1$, $Cs_2$, and $Cs_3$, respectively. In a second phase, the values from the sampling capacitors are integrated (i.e., added) by the integrating capacitor Cin, which has positive polarity for the input path, and negative polarity for the two feedback paths.

It is noted that each input to the adder in each integrator stage of FIG. 6 includes a plus "+" or a minus "−" symbol. The plus symbol indicates that this is a positive input terminal and the input to this port is added to the integration result, while the minus symbol indicates that this is a negative input terminal and the input to this port is subtracted from the integration result. Actually, adding results in sigma, and subtracting results in delta, and this is how the sigma delta modulator gets its name. Accordingly, the circuit implementation in FIG. 7 corresponds to the structure of FIG. 6. The connection in the X path is a non-inverting SC integrator connection for positive integration, the connection in the R path is an inverting SC integrator connection for the negative integration, and the connection in the Vref path can be either a non-inverting or an inverting connection based on DOUT value. As a result of the integration, the input X will be added to the integration output, while the input R will be subtracted from the integration output, and the Vref path's operation will depend on the value of DOUT.

The first phase and the second phase are timed using signals $\Phi_1$ and $\Phi_2$. In one embodiment, $\Phi_1$ and $\Phi_2$ are a pair of non-overlapped clock signals, derived from the same clock source, where $\Phi_1$ and $\Phi_2$ control the timing of signal sampling and signal integration, respectively. More details for signals $\Phi_1$ and $\Phi_2$ are given below with reference to FIG. 9.

The parameters of the configurable interconnection gain of FIG. 6 determine the values of the capacitors in FIG. 7, according to the following formulas:

$$b = \frac{Cs_1}{Cin} \qquad (3)$$

$$r = \frac{Cs_2}{Cin} \qquad (4)$$

-continued $$f = \frac{Cs_3}{Cin} \quad (5)$$

Thus, the values of the configurable couplings (e.g., b) can be adjusted by adjusting the values of the corresponding capacitors (e.g., $Cs_1$ and Cin). In addition, the values of variable switches $sw_1$ and $sw_2$ are a function of the output $\Phi_1$ and $\Phi_2$ and of the feedback from the DAC, according to the following equations:

$$sw_1 = \overline{DOUT} \cdot \Phi_1 + DOUT \cdot \Phi_2 \quad (6)$$

$$sw_2 = DOUT \cdot \Phi_1 + \overline{DOUT} \cdot \Phi_2 \quad (7)$$

Therefore, when DOUT is 0, $sw_1 = D_1$ and $sw_2 = D_2$. When DOUT is 1, then $sw_1$, $\Phi_2$ and $sw_2 = \Phi_1$.

FIG. 8 illustrates a configurable adder of the modulator of FIG. 6, according to one embodiment. As in the circuit of FIG. 7, the configurable couplings $a_i$ are adjusted by adjusting the values of capacitors, which include $Css_i$ and Csi in this embodiment. Each of the feed-forward inputs $I_i$ is sampled by the sampling capacitors $Css_i$, and then integrated by the integrating capacitor Csi with positive polarity. Each input line $I_1$-$I_5$ is coupled through variable switches, controlled by signals $\Phi_1$ and $\Phi_2$, to a corresponding charging capacitor $Css_i$. Clock signal $\Phi_1$ is used to charge the $Css_i$, and clock signal $\Phi_2$ is used to charge the output capacitor Csi and do the summation. The values $a_i$ are adjusted by adjusting the corresponding capacitor $Css_i$ according to the following formula:

$$a_i = \frac{Css_i}{Csi} \quad (8)$$

Figure 9:
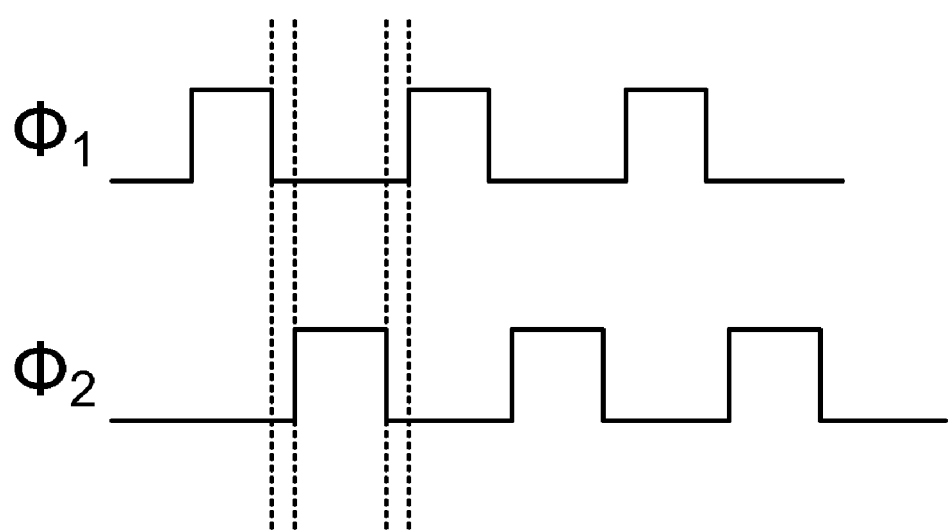
FIG. 9 shows the waveforms of clock signals $\Phi_1$ and $\Phi_2$, in accordance with one embodiment.

FIG. 9 shows the waveforms of clock signals $\Phi_1$ and $\Phi_2$, in accordance with one embodiment. In this embodiment, $\Phi_1$ and $\Phi_2$ are non-overlapped clocks from the same clock source used to control the timing for the signal sampling and for the integration of the sampled signals. $\Phi_1$ and $\Phi_2$ have a phase difference of 180 degrees, and $\Phi_1$ and $\Phi_2$ are processed to not have a value of high at the same time. A buffer time period is included before and after the time that $\Phi_2$ has a high value to prevent the signal sampling and integration from happening at same time, thus avoiding charge leaking. The gaps between the two dash lines illustrate the non-overlapping areas.

Figures 10, 11:
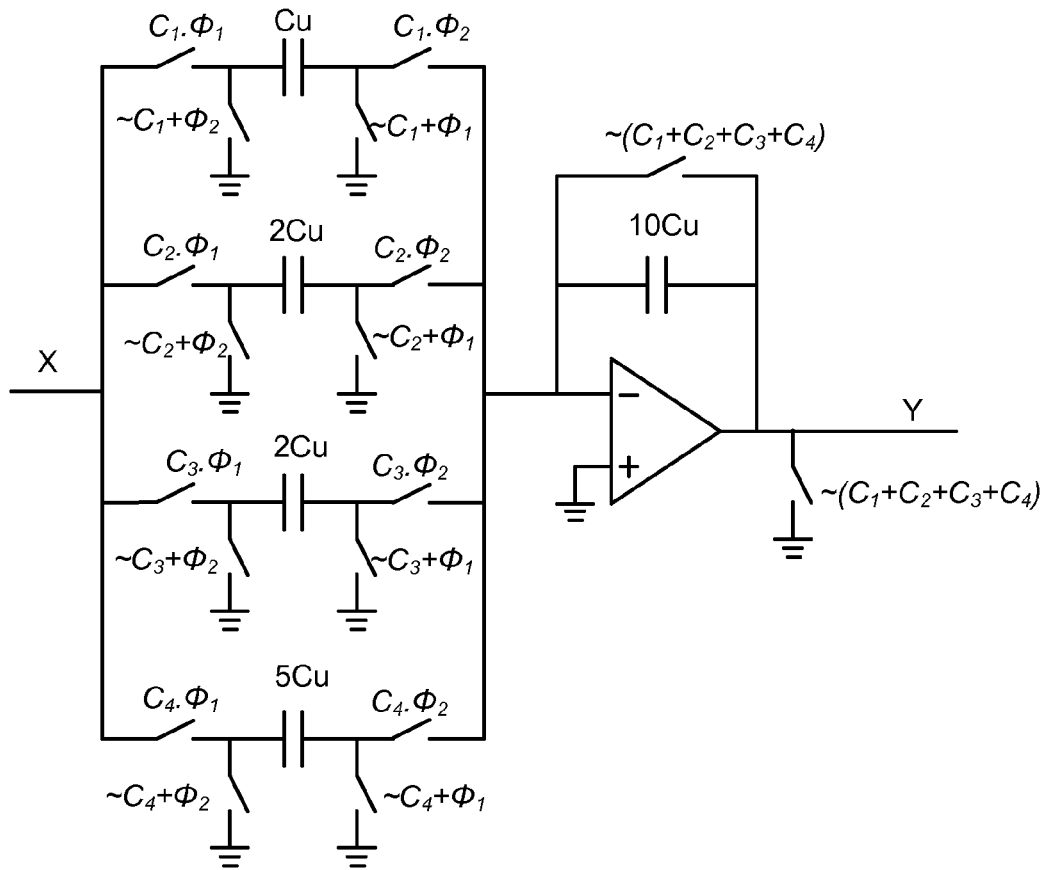
FIG. 10 shows a circuit for combining capacitors based on the values in the PLD configuration file, according to one embodiment.
FIG. 11 shows a table illustrating the value of the capacitor resulting from combining unit capacitors based on the values in the PLD configuration file, according to one embodiment.

FIG. 10 shows a circuit for configuring capacitors based on the values in the PLD configuration file, according to one embodiment. FIG. 10 illustrates an embodiment of an SC integrator with a single input path. One factor in the performance of the analog integrator is the accuracy of element matching. Fabrication process variations, local variations, and other factors, can affect the operability of the ADC. In particular, for an accurate gain in the ADC, the Cs/Cin ratio must be accurate. In one embodiment, Cs and Cin are broken into smaller capacitance units Cu, also referred to as unit capacitors. When the unit capacitors are disposed closely on the chip, a matching accuracy of 0.1% or more can be achieved. This matching accuracy is appropriate for implementing embodiments of the ADC.

In general, the greater the capacitance, the greater the risk of a mismatch from the intended capacitance value. In one embodiment, the capacitors are formed by combining smaller capacitors. For example, to obtain a capacitor with a value of 10 units, ten capacitors with a value of a single unit are combined by coupling the unit capacitors in parallel. The resulting combination capacitor will be equivalent to the intended capacitor. In addition, by using smaller capacitors, the IC does not need to have large capacitors, which requires more complex and costlier IC manufacturing techniques.

The sampling capacitor Cs and the integrating capacitor Cin are formed by combining 10 unit capacitors Cu. The unit capacitors are physically arranged on the IC in a 4×4 array, with 6 unused units tied to ground. In one embodiment, the 10 units in the array are pre-connected as four combinable capacitors with values of 1Cu, 2Cu, 2Cu, and 5Cu. These combinable capacitors can then be combined to obtain any capacitor with a value from 0Cu to 10Cu. For example, a capacitor of value 7Cu is obtained by combining a 2Cu capacitor with the 5Cu capacitor. More details on how to combine the capacitors are given below with reference to FIG. 11.

Based on the gain (Cs/Cin), the number of Cu's required is calculated. CRAM bits in the configuration file for the IC are used to select how the capacitors are combined. In FIG. 10, $C_1$-$C_4$ are the CRAM configuration bits associated with the capacitors with values Cu, 2Cu, 2Cu, and 5Cu, respectively. Thus, if $C_1$ has a logical value of 0, then the first capacitor with value Cu will be disabled and isolated by virtue of the switch with value ($C_1 \cdot \Phi_1$) (logical AND of $C_1$ and $\Phi_1$), and the output will be fixed to ground by virtue of the switch with value ($\sim C_1 + \Phi_1$) (logical OR of (NOT $C_1$) and $\Phi_1$). On the other hand, if $C_1$ has a value of 1, the capacitor Cu will be operative and the switches will have the values of $\Phi_1$ and $\Phi_2$, as previously described. If all capacitors are configured with a value of logical 0, then the output will be fixed to ground (logical 0) by virtue of the switch on the output with value $\sim(C_1+C_2+C_3+C_4)$.

It is appreciated that the embodiment illustrated in FIG. 10 is an exemplary circuit for obtaining capacitors by combining smaller capacitors. Other embodiments may utilize different capacitance units, or a different number of weighted capacitors. The embodiment illustrated in FIG. 10 should therefore not be interpreted to be exclusive or limiting, but rather exemplary or illustrative.

FIG. 11 shows a table illustrating the value of the capacitor resulting from combining unit capacitors based on the values in the PLD configuration file, according to one embodiment. The combinable capacitors can be given a weight of 0 or 1, as specified by the corresponding CRAM configuration bit, to obtain any value from 0 to 10 Cu. The table of FIG. 11 shows the resulting $C_{Total}$ obtained by combining the different combinable capacitances. In this fashion, the capacitors needed to configure the ADC can be configured.

Figure 12:
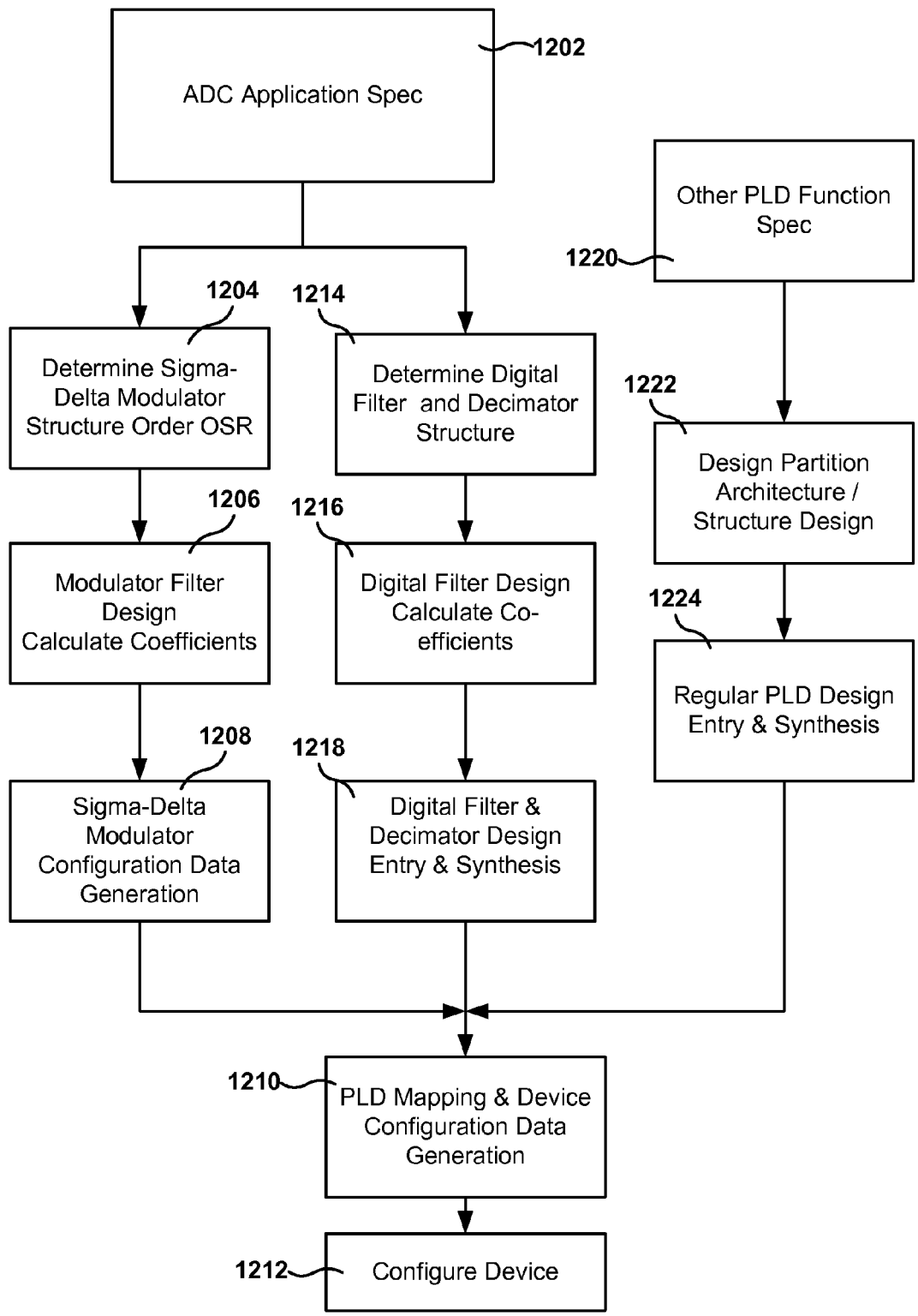
FIG. 12 shows a flowchart illustrating a method for designing an Integrated Circuit (IC).

FIG. 12 shows a flowchart illustrating a method for designing an Integrated Circuit (IC). In one embodiment, the conventional PLD design flow is enhanced to integrate a design procedure for the ADC. In operation 1202, the design parameters for the ADC are defined, such as low-pass or band-pass filter, input analog signal bandwidth, conversion accuracy, power consumption, etc. In operation 1204, the analog part of the ADC is initiated by determining the structure of the SD analog modulator, the order of the modulator, OSR, etc. From operation 1204, the method proceeds to operation 1206 to calculate the coefficients of the structured modulator, including the calculation of the parameters for the configurable couplings, such as coefficients $b_i$, $c_i$, $d_i$, and $g_i$ of FIG. 5. In operation 1208, the configuration data for the IC configuration file is generated, including the CRAM bits that will configure the components of the ADC, such as coefficients $C_i$ of FIG. 10.

In operation 1214, the design of the digital filter and decimator takes place by determining the filter structure or by utilizing a pre-defined structure that can be applied to all modulators. In operation 1216, a dedicated digital filter design tool or a math tool is used to calculate the coefficients of the digital filter. In operation 1218, the designed filter is entered and synthesized as a PLD DSP IP block.

In operation 1220, the functional specifications for other blocks in the FPGA are entered by the design engineer in a Computer Aided Design (CAD) tool, or some other PLD design tool. In operation 1222, the design tool determines the architecture for modules in the FPGA, and in operation 1224, standard design entry and synthesis of the PLD design are performed.

The design of the different modules converges in operation 1210 at the device mapping stage where different logic parts of the design are mapped into different physical parts in the device, including the configurable ADC, the soft IP of the digital filter and the decimator. The full chip configuration data is then generated. In operation 1212, the FPGA is configured with the obtained configuration.

Figure 13:
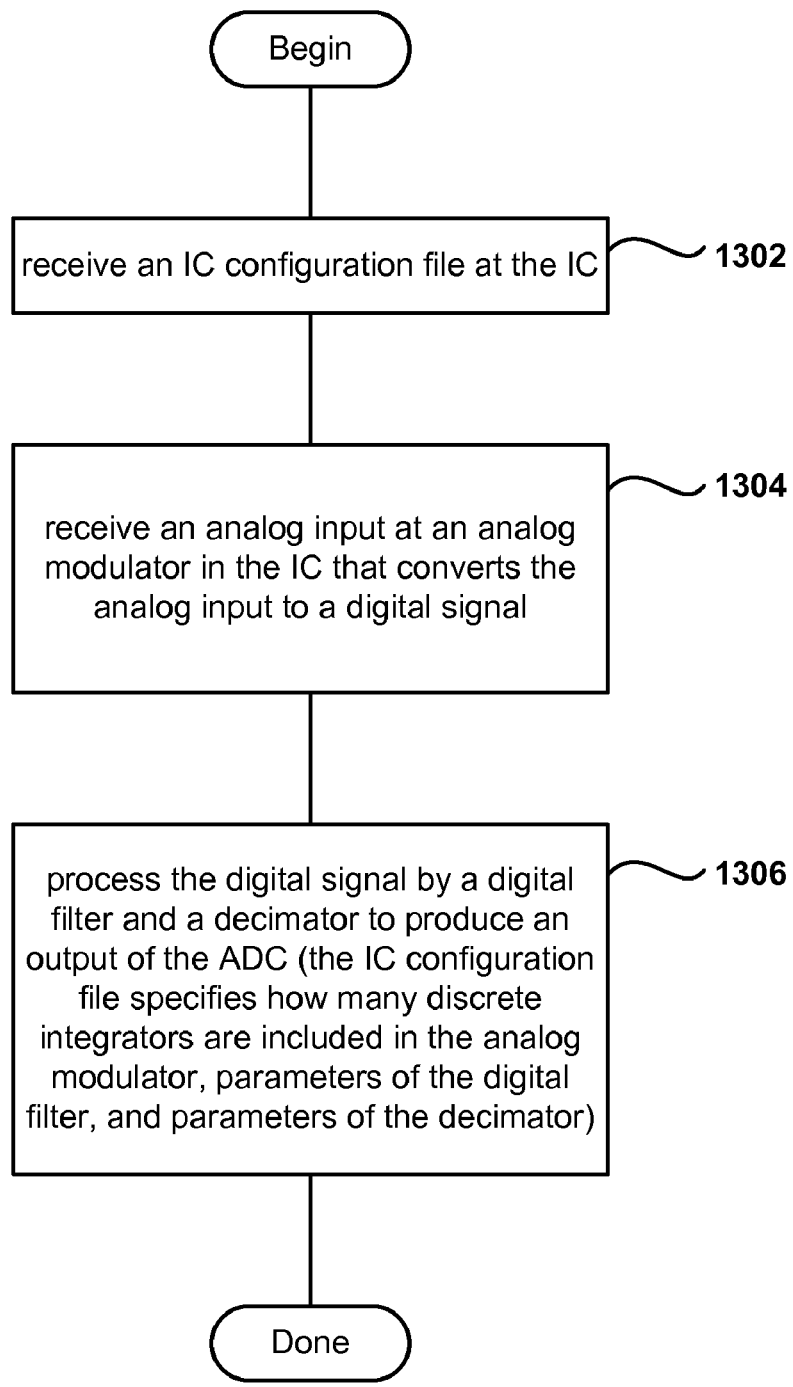
FIG. 13 shows a flowchart illustrating an algorithm for providing an analog to digital converter (ADC) in an integrated circuit (IC), according to one embodiment.

FIG. 13 shows a flowchart illustrating a method for operating an integrated circuit (IC) with an embedded analog to digital converter (ADC), according to one embodiment. In operation 1302, an IC configuration file is received at the IC to configure the IC. Further, in operation 1304, an analog input is received at an analog modulator in the IC. The analog modulator converts the analog input to a digital signal, and the analog modulator includes one or more discrete integrators and a feedback path from an output of the analog modulator to at least one of the one or more discrete integrators.

From operation 1304, the method continues to operation 1306, where the digital signal is processed by a digital filter and a decimator to produce the output of the ADC. The IC configuration file specifies how many discrete integrators are included in the analog modulator, the parameters of the digital filter, and the parameters of the decimator.

The embodiments, thus far, were described with respect to integrated circuits and PLDs. The method and apparatus described herein may be incorporated into any suitable circuit. For example, the method and apparatus may be incorporated into numerous types of devices such as microprocessor or programmable logic devices. Exemplary of programmable logic devices include Programmable Arrays Logic (PALs), Programmable Logic Arrays (PLAs), Field Programmable Logic Arrays (FPLAs), Electrically Programmable Logic Devices (EPLDs), Electrically Erasable Programmable Logic Devices (EEPLDs), Logic Cell Arrays (LCAs), Field Programmable Gate Arrays (FPGAs), Application Specific Standard Products (ASSPs), Application Specific Integrated Circuits (ASICs), just to name a few.

The programmable logic device described herein may be part of a data processing system that includes one or more of the following components; a processor; memory; input/output circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. In yet another example, the programmable logic device can be configured as an interface between a processor and one of the other components in the system. In one embodiment, the programmable logic device may be one of the families of devices owned by the assignee.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments can also be fabricated as computer readable code on a non-transitory computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, will be apparent that certain changes and modifications can be practiced within the scope of the appended claims.

Accordingly, the present embodiments are to be considered as illustrative and not restrictive, and the embodiments are not to be limited to the details given herein, but may be modified within the scope and equivalents of the appended claims.

What is claimed is:

1. An integrated circuit (IC) with analog to digital converter (ADC), the IC comprising:
   an analog modulator including,
      one or more discrete integrators, wherein a first discrete integrator from the one or more discrete integrators is operable to receive an analog input of the ADC; and a feedback path from an output of the analog modulator to at least one of the one or more discrete integrators;
a digital filter coupled to the analog modulator; and
a decimator coupled to the digital filter, the decimator operable to produce an output of the ADC, wherein the IC is operable to receive an IC configuration file that specifies how many discrete integrators are to be used in the analog modulator, parameters of the digital filter, and parameters of the decimator.

2. The IC as recited in claim 1, wherein the one or more discrete integrators are coupled serially, wherein the analog modulator further includes:
an adder operable to combine outputs from the one or more discrete integrators, wherein the adder is configurable by the parameters of the digital filter received in the IC configuration file.

3. The IC as recited in claim 2, wherein the adder includes:
first configurable switches, each first configurable switch controlled by a respective clock signal;
second configurable switches, each second configurable switch controlled by a respective clock signal;
sampling capacitors for sampling the outputs from the one or more discrete integrators received through the first configurable switches; and
an amplifier coupled to the sampling capacitors via the second configurable switches, wherein the output of the amplifier provides an output for the adder.

4. The IC as recited in claim 1, wherein the analog modulator further includes:
configurable feedback couplings from an output of a second discrete integrator of the one or more discrete integrators to an input of a third discrete integrator of the one or more integrators, wherein the IC configuration file specifies a configuration of the feedback couplings.

5. The IC as recited in claim 4, wherein the configurable feedback couplings are selected from a group consisting of an open circuit, a short circuit, a connection to ground, a connection to a power source, an impedance, a gain, or a loss.

6. The IC as recited in claim 1, wherein each discrete integrator includes a configurable integrator.

7. The IC as recited in claim 1, wherein the IC is a Field-Programmable Gate Array (FPGA), and wherein the digital filter is implemented with programmable resources of the FPGA.

8. The IC as recited in claim 1, wherein the IC is a Field-Programmable Gate Array (FPGA), and wherein the decimator is implemented with programmable resources of the FPGA.

9. The IC as recited in claim 1, wherein the IC configuration file includes a plurality of configuration bits, wherein the configuration bits define how many discrete integrators to be used, the parameters of the digital filter, and the parameters of the decimator.

10. The IC as recited in claim 1, wherein each discrete integrator includes sampling capacitors operable to sample inputs of the discrete integrator.

11. The IC as recited in claim 1, wherein each discrete integrator includes sampling capacitors, each sampling capacitor being a combination of weighted capacitors in the IC, wherein the IC configuration files determines a structure of the combination of weighted capacitors.

12. The IC as recited in claim 1, wherein each discrete integrator includes configurable switches, each configurable switch controlled by a clock signal from a plurality of clock signals.

13. The IC as recited in claim 1, wherein the first discrete integrator includes:
one or more first configurable switches, each first configurable switch controlled by a clock signal for the each first configurable switch;
one or more second configurable switches, each second configurable switch controlled by the feedback path and by a clock signal for the each second configurable switch; and
sampling capacitors for sampling inputs to the first discrete integrator, the sampling inputs including a reference voltage, the analog input, and a feedback from a second discrete integrator.

14. The IC as recited in claim 13, wherein a capacitance value for the sampling capacitors is based on the parameters of the digital filter received in the IC configuration file.

15. The IC as recited in claim 1, wherein the analog modulator is operable to receive a pair of clock signals to time sampling of inputs, the pair of clock signals being non-overlapped clock signals.

16. An integrated circuit (IC) with analog to digital converter (ADC), the IC comprising:
a sigma delta (SD) analog modulator including,
a plurality of discrete integrators coupled serially, wherein a first discrete integrator from the plurality of discrete integrators is operable to receive an analog input of the ADC;
a feedback path from an output of the SD analog modulator to at least one discrete integrator from the plurality of discrete integrators; and
configurable feedback couplings from outputs of the plurality of discrete integrators to inputs of the plurality of discrete integrators;
a digital filter coupled to the SD analog modulator; and
a decimator coupled to the digital filter, the decimator operable to produce an output of the ADC, wherein the IC is operable to receive an IC configuration file that specifies how many discrete integrators are to be used in the analog modulator, the feedback couplings, parameters of the digital filter, and parameters of the decimator.

17. The IC as recited in claim 16, wherein the analog input is received through a pin of the IC.

18. The IC as recited in claim 16, wherein the feedback path is operable to receive a single bit from a quantizer.

19. The IC as recited in claim 16, wherein the feedback path is coupled to an input of each discrete integrator from the plurality of discrete integrators.

20. A method for operating an integrated circuit (IC) with an embedded analog to digital converter (ADC), the method comprising:
receiving an IC configuration file to configure the IC;
receiving an analog input into an analog modulator of the IC;
converting the analog input to a digital signal; and
processing the digital signal by a digital filter and a decimator to produce an output of the ADC, wherein the IC configuration file specifies a number of discrete integrators to be used in the analog modulator, parameters of the digital filter, and parameters of the decimator.

21. The method as recited in claim 20, further including:
configuring feedback couplings from an output of the one or more discrete integrators to an input of another of the one or more integrators based on the IC configuration file.

22. The method as recited in claim 21, wherein the feedback couplings include sampling capacitors operable to sample inputs of the discrete integrator.

23. The method as recited in claim 20, wherein the analog modulator includes configurable local feedback paths from an output of each discrete integrator to an input of a previous discrete integrator, the configurable local feedback paths determining a noise transfer function of the analog modulator.

24. The method as recited in claim 20, wherein the analog modulator includes a plurality of variable switches controlled by one or more clock signals.

* * * * *